(12) United States Patent
Rezaeifar Bayat et al.

(10) Patent No.: US 12,707,730 B2
(45) Date of Patent: Aug. 11, 2026

(54) PHOTODETECTOR WITH SEGMENTED ABSORBERS

(71) Applicant: Cisco Technology, Inc., San Jose, CA (US)

(72) Inventors: Fatemeh Rezaeifar Bayat, Mission Viejo, CA (US); Kam Yan Hon, Irvine, CA (US); Attila Mekis, Carlsbad, CA (US); Gianlorenzo Masini, Carlsbad, CA (US)

(73) Assignee: Cisco Technology, Inc., San Jose, CA (US)

( * ) Notice: Subject to any disclaimer, the term of this patent is extended or adjusted under 35 U.S.C. 154(b) by 441 days.

(21) Appl. No.: 17/816,255

(22) Filed: Jul. 29, 2022

(65) Prior Publication Data

US 2024/0038920 A1 Feb. 1, 2024

(51) Int. Cl.
*H10F 30/225* (2025.01)

(52) U.S. Cl.
CPC ................................ *H10F 30/2255* (2025.01)

(58) Field of Classification Search
CPC ................................................... H10F 30/2255
See application file for complete search history.

(56) References Cited

U.S. PATENT DOCUMENTS 7,358,527 B1 * 4/2008 Masini .................... H01L 22/32 257/E31.001
11,049,851 B2 6/2021 Hon et al.
2003/0085441 A1 * 5/2003 Colace .................. H01S 5/0687 257/E31.022
2017/0040469 A1 2/2017 Alloatti
2017/0123239 A1 * 5/2017 Ayazi ...................... G02F 1/025
2017/0194522 A1 7/2017 Wang et al.
2019/0331866 A1 * 10/2019 Mekis ................. G02B 6/4208
2020/0124791 A1 4/2020 Bayn et al.
2020/0209704 A1 * 7/2020 Masini ................... G02F 1/225
2021/0313483 A1 10/2021 Jou et al.
2022/0200244 A1 * 6/2022 Zilkie ................. H01S 5/06837
2023/0408763 A1 * 12/2023 Wu .......................... G02B 6/13
2024/0036364 A1 * 2/2024 Chua ..................... G02F 1/0147
2024/0170055 A1 * 5/2024 Jacob .................... G11C 13/047
2024/0194813 A1 * 6/2024 Hon ...................... H10F 71/127

OTHER PUBLICATIONS

Qianhuan Yu et al., "Segmented Waveguide Photodetector with 90% Quantum Efficiency," Optics Express, vol. 26, No. 10, dated May 14, 2018, pp. 1-7.

(Continued)

*Primary Examiner* — Nathan W Ha
(74) *Attorney, Agent, or Firm* — Patterson + Sheridan, LLP

(57) ABSTRACT

A photodetector includes a substrate, a first optical absorber, and a second optical absorber. The first optical absorber is disposed in the substrate along a direction of propagation of an optical signal through the substrate. The first optical absorber is offset in the substrate according to an offset of the optical signal in a direction orthogonal to the direction of propagation. The second optical absorber is disposed in the substrate along the direction of propagation of the optical signal. The second optical absorber is offset in the substrate according to the offset of the optical signal in the direction orthogonal to the direction of propagation.

18 Claims, 9 Drawing Sheets

(56) References Cited

OTHER PUBLICATIONS

NK Hon, S Sahni, A Mekis, G Masini, "Design and performance of high-speed Ge-on-Si waveguide photodiodes," IEEE, Aug. 23-25, 2017 [Abstract Only].
S. Sahni, N.K. Hon, G. Masini, "The Dual-Heterojunction Ge on Si Photodetector," Luxtera, Inc., ECS Transactions, Year: 2014, p. 783-789.
U.S. Appl. No. 17/815, 115, filed Jul. 26, 2022.

* cited by examiner 102
328
506
406
400
408
404
330
504
406
400
408
404
332
502
406
400
402
408
404
326

PHOTODETECTOR WITH SEGMENTED ABSORBERS

TECHNICAL FIELD

Embodiments presented in this disclosure generally relate to optical communications. More specifically, embodiments disclosed herein relate to photodetectors.

BACKGROUND

High-speed optical transceivers are prevalent in datacenters. Germanium (Ge) waveguide photodetectors are key elements of these transceivers, implementing the functionality of converting the optical data streams into the electrical domain. To properly accomplish this functionality, the photodetectors should be efficient and fast.

The response speed of Ge photodetectors may be limited by the amount of time it takes for photogenerated carriers to travel across the absorption region of the photodetector and to reach the electrodes to deliver the photocurrent response, which may also be referred to as the transit time. The transit time may be improved by reducing the distance that the photogenerated carriers travel. For example, the width of the absorption region may be reduced to reduce the travel distance. Process limitations, however, limit how much the width of the absorption region may be reduced.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
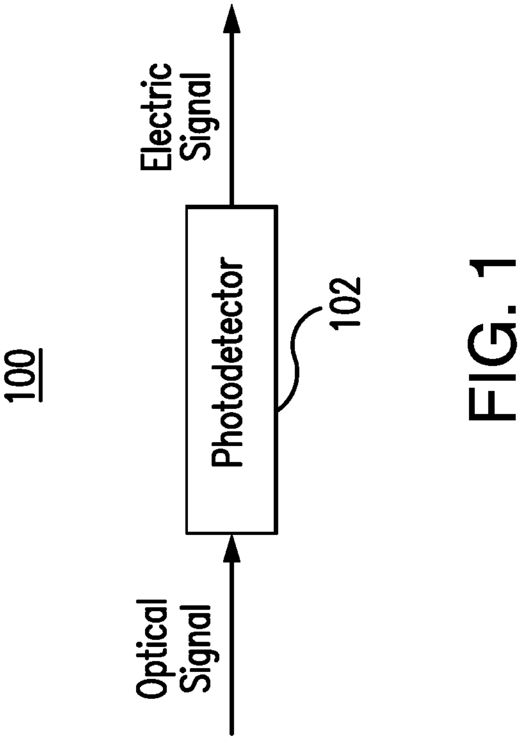
FIG. 1 illustrates an example optical system.

According to an embodiment, a photodetector includes a substrate, a first optical absorber, and a second optical absorber. The first optical absorber is disposed in the substrate along a direction of propagation of an optical signal through the substrate. The first optical absorber is offset in the substrate according to an offset of the optical signal in a direction orthogonal to the direction of propagation. The second optical absorber is disposed in the substrate along the direction of propagation of the optical signal. The second optical absorber is offset in the substrate according to the offset of the optical signal in the direction orthogonal to the direction of propagation.

According to another embodiment, a method includes directing an optical signal through a first optical absorber disposed in a substrate. The first optical absorber is offset in the substrate according to an offset of the optical signal in a direction orthogonal to the direction of propagation. The method also includes directing the optical signal through a second optical absorber disposed in the substrate. The second optical absorber is offset in the substrate according to the offset of the optical signal in the direction orthogonal to the direction of propagation.

According to another embodiment, a photodetector includes a substrate, a first doped region, a second doped region, a third doped region, a first optical absorber, and a second optical absorber. The first doped region is disposed in the substrate. The second doped region is disposed in the substrate. The second doped region has an opposite doping relative to the first doped region. The third doped region is disposed in the substrate. The third doped region has an opposite doping relative to the first doped region. The first optical absorber is disposed in the substrate along a direction of propagation of an optical signal through the substrate. The first optical absorber contacts the first doped region and the second doped region. The second optical absorber is disposed in the substrate along the direction of propagation of the optical signal. The second optical absorber contacts the first doped region and the third doped region. The first optical absorber and the second optical absorber are positioned closer to a lower end of the substrate than an upper end of the substrate opposite the lower edge. The upper end and the lower end extend parallel to a direction of propagation of the optical signal.

EXAMPLE EMBODIMENTS

A photodetector (e.g., a germanium photodetector) may produce an electric signal when an optical signal passes through the photodetector. For example, the optical signal may separate negatively charged electrons and positively charged carriers in an absorber region of the photodetector to create an electric signal. When an offset is introduced to an input waveguide carrying the optical signal, the intensity of the optical signal may vary in a periodic zigzag pattern as the optical signal travels through the photodetector. As a result, the intensity of the optical signal may be offset in directions perpendicular to the direction of propagation. For example, if the optical signal is propagating laterally (e.g., from left to right), the intensity of the optical signal may offset vertically (e.g., upwards or downwards). This offset may appear to change periodically (e.g., move between upwards and downwards) as the optical signal propagates. As a result, portions of the absorber region may not be aligned with the optical signal across the length of the photodetector.

The present disclosure describes a photodetector with segmented optical absorbers positioned according to the offset of the optical signal. Specifically, the absorbers may be positioned in the photodetector such that the absorbers align with the periodic zigzag offset of the optical signal as the optical signal propagates through the photodetector. If the optical signal in one region of the photodetector is closer to one edge of the photodetector as a result of the offset, the absorber may be positioned closer to that edge in that region of the photodetector. As a result, the absorbers may be offset from each other such that the absorbers are aligned with the offsets of the optical signal. Additionally, the absorbers are positioned closer to particular edges of the photodetector relative to other edges. The photogenerated carriers from the absorbers may then be directed to the edges closest to the absorbers, which reduces the travel distance and the transit time of the photocarriers, in certain embodiments. As a result, the speed of the photodetector is improved.

FIG. 1 illustrates an example optical system 100. As seen in FIG. 1, the optical system 100 includes a photodetector 102 that converts an optical signal into an electric signal. The optical signal passes through optical absorbers in the photodetector 102 to separate positively charged carriers and negatively charged electrons. The carriers travel to anodes in the photodetector 102 and the electrons travel to cathodes in the photodetector 102 to produce the electric signal. The distance that the carriers or electrons travel to reach an anode or a cathode affects the speed or response of the photodetector 102. Reducing this travel distance may improve the speed or response of the photodetector 102.

Figure 2:
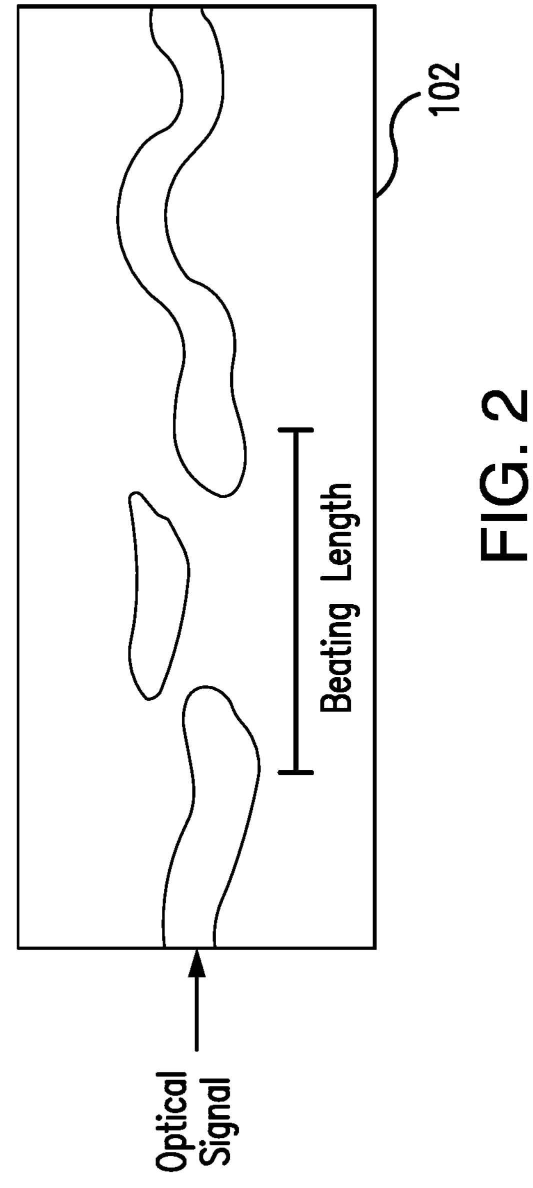
FIG. 2 illustrates an example optical signal in the optical system of FIG. 1.

FIG. 2 illustrates an example optical signal in the optical system 100 of FIG. 1. As seen in FIG. 2, the optical signal may not pass as a linear beam through the photodetector 102. Rather, an offset in an input waveguide carrying the optical signal may cause the optical signal to move between two ends of the photodetector 102 in a direction orthogonal to the direction of propagation. In the example of FIG. 2, the optical signal propagates through the photodetector 102 from left to right. As the optical signal propagates through the photodetector 102, the optical signal shifts closer to the upper or lower ends of the photodetector 102 in a zigzag pattern. As a result, in certain portions of the photodetector 102, the optical signal may be closer to the upper edge of the photodetector 102, and in other portions of the photodetector 102, the optical signal may be closer to the lower edge of the photodetector 102. This movement of the optical signal between the upper and lower ends of the photodetector 102 has a periodicity characterized by a beating length, which may loosely be the period of the beating of the optical signal through the photodetector 102.

The optical absorbers, anodes, and cathodes in the photodetector 102 may be arranged to match or coincide with the offset of the optical signal through the photodetector 102. Using the example of FIG. 2, in portions of the photodetector 102 where the optical signal is closer to the upper edge than the lower edge of the photodetector 102, the absorbers may be positioned closer to the upper edge than the lower edge. In portions of the photodetector 102 where the optical signal is closer to the lower edge than the upper edge, the absorbers may be positioned closer to the lower edge than the upper edge. Additionally, because positively charged carriers tend to travel slower than negatively charged electrons, it may be beneficial to reduce the travel distance for the positively charged carriers. The anodes may be positioned on the sides of their corresponding absorbers that are closer to the upper edge or the lower edge of the photodetector 102 consistent with the placement of the absorbers. So if an absorber is positioned closer to the upper edge than the lower edge of the photodetector 102, then the anode for that absorber may also be positioned closer to the upper edge than to the lower edge of the photodetector 102. As a result, the travel distance of the positively charged carriers from the absorbers through the anodes is reduced. Thus, by placing the absorbers, anodes, and cathodes according to the beating of the optical signal, the speed of the photodetector 102 is improved, in some embodiments.

Figure 3:
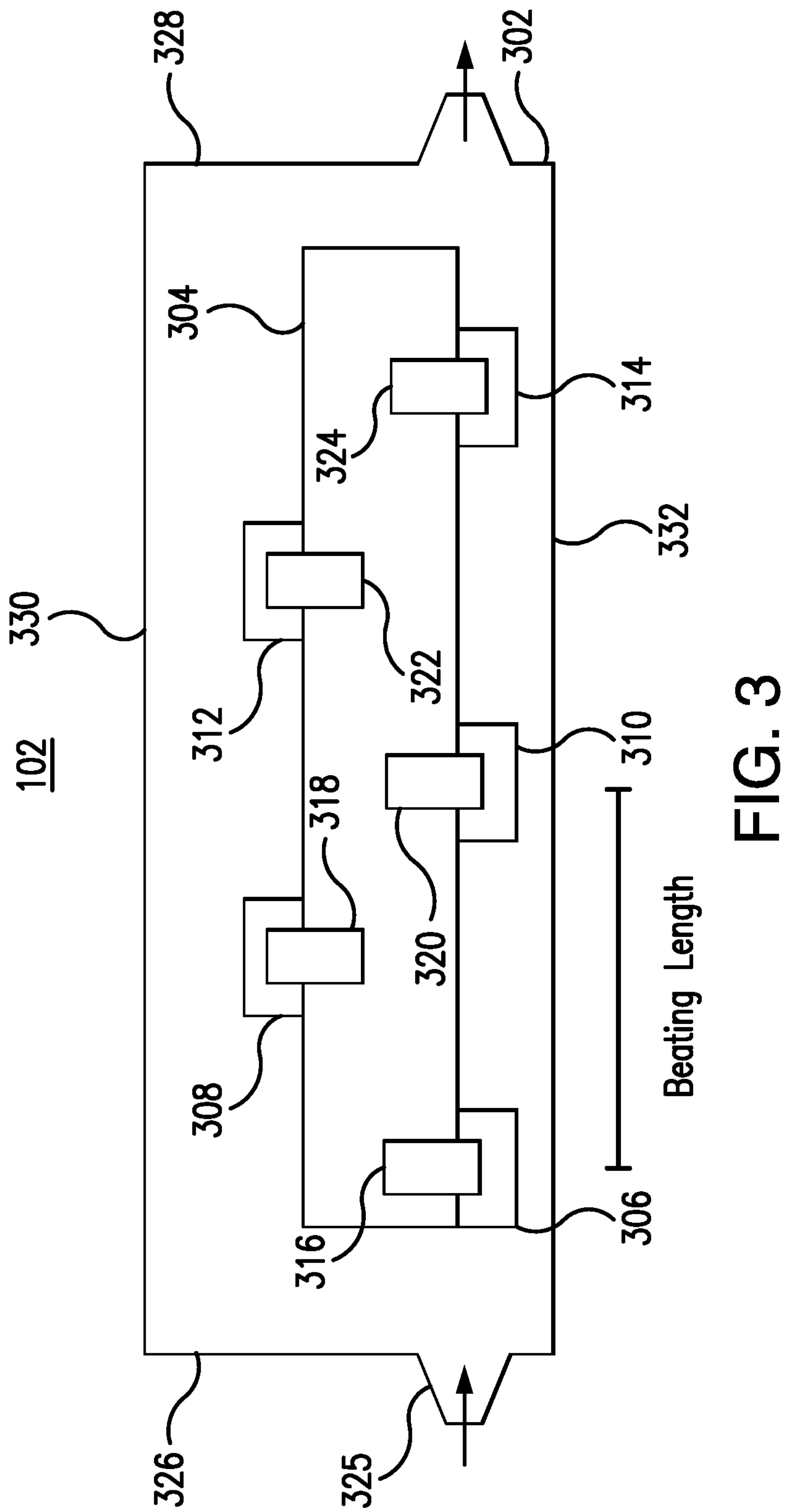
FIG. 3 illustrates an example photodetector in the optical system of FIG. 1.

FIG. 3 illustrates an example photodetector 102 in the optical system 100 of FIG. 1. As seen in FIG. 3, the photodetector 102 includes a substrate 302, a cathode 304, anodes 306, 308, 310, 312, and 314, and optical absorbers 316, 318, 320, 322, and 324. Generally, the absorbers 316, 318, 320, 322, and 324 are positioned on the substrate 302 according to the offset of an optical signal in the photodetector 102. As a result, the optical signal passes through the absorbers 316, 318, 320, 322, and 324. Additionally, the length of the anodes 306, 308, 310, 312, and 314 (e.g., the length in a direction orthogonal to the direction of propagation of the optical signal) is also reduced, which reduces the travel distance for the positively charged carriers.

The substrate 302 forms the foundation for other components of the photodetector 102. For example, the cathode 304, anodes 306, 308, 310, 312, and 314 and the absorbers 316, 318, 320, 322, and 324 may be formed on, above, or within the substrate 302. The substrate 302 may be formed using any suitable material (e.g., silicon). The substrate 302 includes an end 326 and an end 328 opposite the end 326. The substrate also includes an upper end 330 and a lower end 332 opposite the upper end 330. The upper end 330 and the lower end 332 extend parallel to the direction of propagation of the optical signal. The optical signal enters the substrate 302 at the end 326 and exits the substrate at the end 328. The absorbers 316, 318, 320, 322, and 324 and the anodes 306, 308, 310, 312, and 314 may be offset such that they are closer to the upper end 330 or the lower end 332.

The cathode 304 and the anodes 306, 308, 310, 312, and 314 may be formed on or within the substrate 302. The cathode 304 and the anodes 306, 308, 310, 312, and 314 may be doped regions that can form tunnel junctions to the absorbers 316, 318, 320, 322, and 324. The cathode 304 may have an opposite doping to the anodes 306, 308, 310, 312, and 314. In the example of FIG. 3, the cathode 304 may be a singular structure that spans across the substrate 302 along the direction of the propagation of the optical signal. The anodes 306, 308, 310, 312, and 314 are positioned along the cathode 304. The anodes 306, 310, and 314 are positioned along the lower edge of the cathode 304 closer to the lower end 332 of the substrate 302. The anodes 308 and 312 are positioned along the upper edge of the cathode 304 and closer to the upper end 330 of the substrate 302. The positioning of the anodes 306, 308, 310, 312, and 314 alternate between the lower edge and the upper edge of the cathode 304, consistent with the beating of the optical signal through the photodetector 102.

The absorbers 316, 318, 320, 322, and 324 may include any suitable material (e.g. germanium). The absorbers 316, 318, 320, 322, and 324 are positioned on the cathode 304 and the anodes 306, 308, 310, 312, and 314. The absorbers 316, 318, 320, 322, and 324 are offset in a direction orthogonal to the direction of propagation of the optical signal. The absorbers 316, 320, and 324 are positioned closer to the lower end 332 of the photodetector 102 than the upper end 330. The absorbers 318 and 322 are positioned closer to the upper end 330 of the substrate 302 than the lower end 332. The positioning of the absorbers 316, 318, 320, 322, and 324 is consistent with the offset of the optical signal as the optical signal propagates through the photodetector 102. As seen in FIG. 3, the input 325 to the photodetector 102 is offset such that the input 325 is closer to the lower end 332 of the photodetector 102 than the upper end 330. As a result of the offset of the input 325, as the optical signal propagates through the photodetector 102, the optical signal oscillates between the upper end 330 and the lower end 332 with a periodicity, which may also be referred to as the beating length. The absorbers 316, 318, 320, 322, and 324 are positioned along the direction of propagation of the optical signal. Additionally, the absorbers 316, 318, 320, 322, and 324 are also offset in a direction orthogonal to the direction of propagation such that the absorbers 316, 320, and 324 are positioned closer to the lower end 332 and the absorbers 318 and 322 are positioned closer to the upper end 330. The positioning of the absorbers 316, 318, 320, 322, and 324 allows the optical signal to pass through the absorbers 316, 318, 320, 322, and 324, even though the optical signal oscillates between the upper end 330 and the lower end 332.

As seen in FIG. 3, the absorbers 316 and 320 are separated by the beating length of the optical signal. The absorber 318 may be positioned halfway between the absorbers 316 and 320. The absorbers 322 and 324 may be positioned similarly, according to the beating length of the optical signal. The absorber 324 may be separated from the absorber 320 by the beating length of the optical signal. The absorber 322 may be positioned halfway between the absorber 320 and 324. In this manner, the absorbers 316, 318, 320, 322, and 324 are positioned such that the absorbers 316, 318, 320, 322, and 324 align with the optical signal as the optical signal oscillates while propagating through the photodetector 102.

Additionally, the anodes 306, 308, 310, 312, and 314 are arranged such that the positively charged carriers in the absorbers 316, 318, 320, 322, and 324 travel in a direction orthogonal to the direction of propagation of the optical signal. Because the anodes 306, 308, 310, 312, and 314 are positioned according to the beating of the optical signal, the travel distance of the positively charged carriers in the absorbers 316, 318, 320, 322, and 324 through the anodes 306, 308, 310, 312, and 314 is reduced. If the absorbers 316, 318, 320, 322, and 324 were positioned along the midline of the photodetector 102 along the direction of propagation of the optical signal and the anodes 306, 308, 310, 312, and 314 were lengthened in the direction orthogonal to the direction of propagation to extend to the absorbers 316, 318, 320, 322, and 324, then the carriers in the absorbers 316, 318, 320, 322, and 324 would travel a longer distance through the anodes 306, 308, 310, 312, and 314. By positioning the absorbers closer to the upper and lower ends 330 and 332 of the photodetector 102, the length of the anodes 306, 308, 310, 312, and 314 in the direction orthogonal to the direction of propagation of the optical signal may be reduced, which reduces the travel distance of the carriers. As a result, the speed of the photodetector 102 is improved in certain embodiments.

Figure 4:
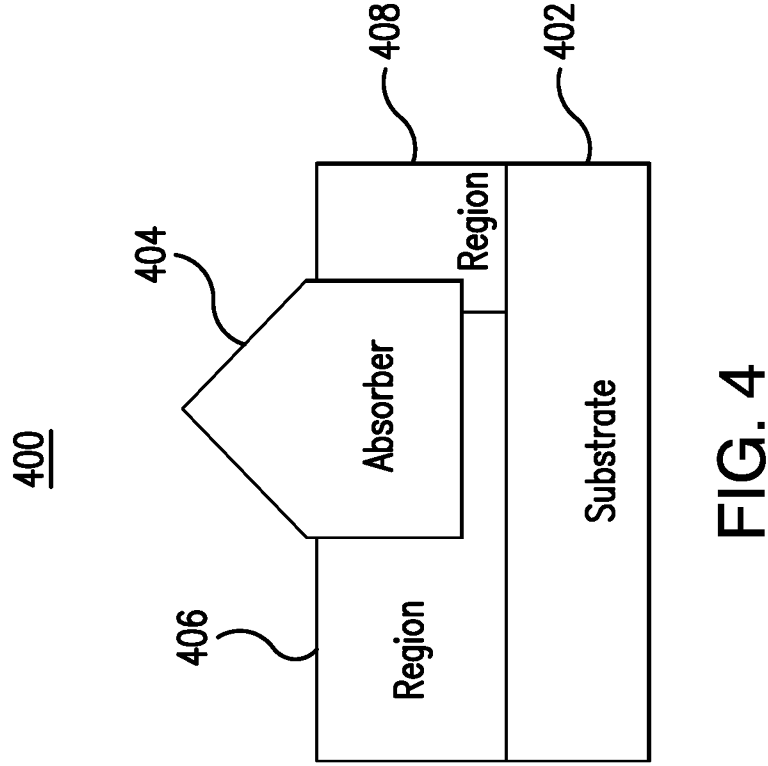
FIG. 4 illustrates an example photodetector region in the optical system of FIG. 1.

FIG. 4 illustrates an example photodetector region 400 in the optical system 100 of FIG. 1. As seen in FIG. 4, the photodetector region 400 includes a substrate 402, an optical absorber 404, a region 406, and a region 408. A photodetector in the optical system 100 of FIG. 1 may include multiple photodetector regions 400.

The substrate 402 forms a foundation for the other components of the photodetector region 400. For example, the absorber 404, the region 406, and the region 408 are formed on, above, or within the substrate 402. The substrate 402 may include any suitable component (e.g., silicon).

The absorber 404, the region 406, and the region 408 form a structure on, above, or within the substrate 402. As seen in FIG. 4, the region 406 and the region 408 are formed on the substrate 402. The absorber 404 is then formed within the regions 406 and 408 above the substrate 402 such that the absorber 404 contacts the region 406 and the region 408. The absorber 404 may include any suitable material (e.g., germanium). The region 406 and the region 408 may be oppositely doped regions that implement tunnel junctions to the absorber 404. In the example of FIG. 4, the region 406 may be a cathode and the region 408 may be an anode. Notably, the region 408 is shorter in length than the region 406. Due to the offset of the optical signal as the optical signal propagates, when the optical signal passes through the absorber 404, the separation of the electron and hole (or carrier) in the absorber 404 may occur closer to the region 408 than the region 406. As a result, the hole (or carrier) that travels to the region 408 travels a shorter distance to reach an electrode in the region 408.

Figure 5:
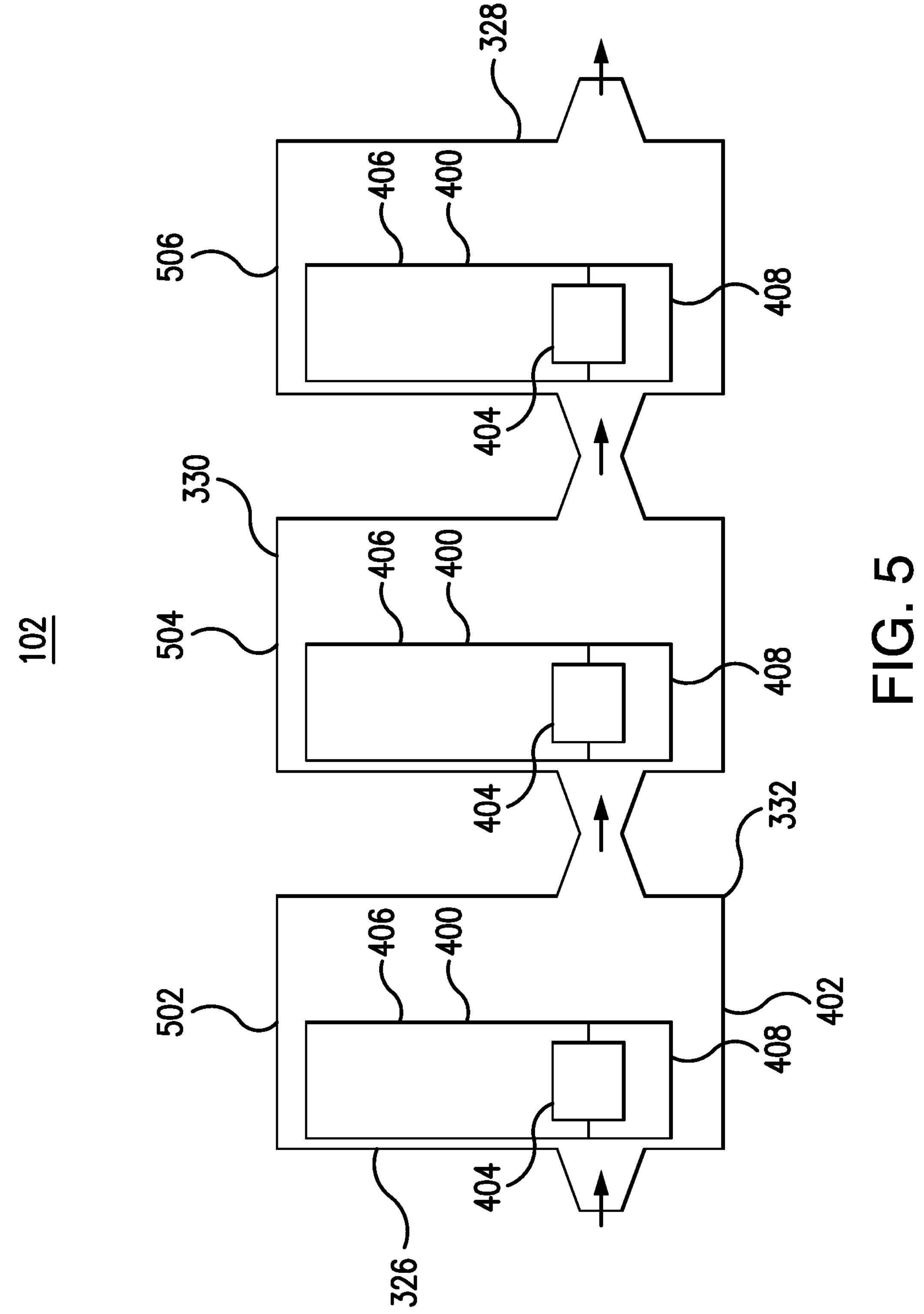
FIG. 5 illustrates an example photodetector in the optical system of FIG. 1.

FIG. 5 illustrates an example photodetector 102 in the optical system 100 of FIG. 1. As seen in FIG. 5, the photodetector 102 includes sections 502, 504, and 506 formed using the substrate 402. The sections 502, 504, and 506 are connected. In some embodiments, the sections 502, 504 and 506 may be connected to each other by a waveguide. In some embodiments, the sections 502, 504, and 506 may be connected to each other by a portion of the substrate 402. The photodetector 102 may include any suitable number of cascaded sections.

Additionally, each section 502, 504, and 506 includes a photodetector region 400 that includes an optical absorber 404, a region 406, and a region 408. In the example of FIG. 5, the sections 502, 504, 506 may be arranged such that the absorbers 404 in the sections 502, 504, and 506 are separated by a beating length of the optical signal propagating through the photodetector 102. The direction of propagation is indicated by the arrows in FIG. 5. The absorbers 404 are offset closer to the lower end 332 of the substrate 402 than the upper end 330 according to the beating of the optical signal. The upper end 330 and the lower end 332 extend parallel to the direction of propagation of the optical signal. As a result, the absorbers 404 may be positioned in the photodetector 102 such that the optical signal passes through the absorbers 404 as the optical signal beats while propagating through the photodetector 102.

In the example of FIG. 5, each region 406 may be a cathode and each region 408 may be an anode. As seen in FIG. 5, each anode would be shorter in length than its corresponding cathode in a direction orthogonal to the direction of propagation of the optical signal. Each absorber 404 is positioned on an anode and a cathode. In this manner, the travel distance for the positively charged carriers in each absorber 404 may be shorter than the travel distance for the negatively charged electrons in the absorber 404.

Figure 6:
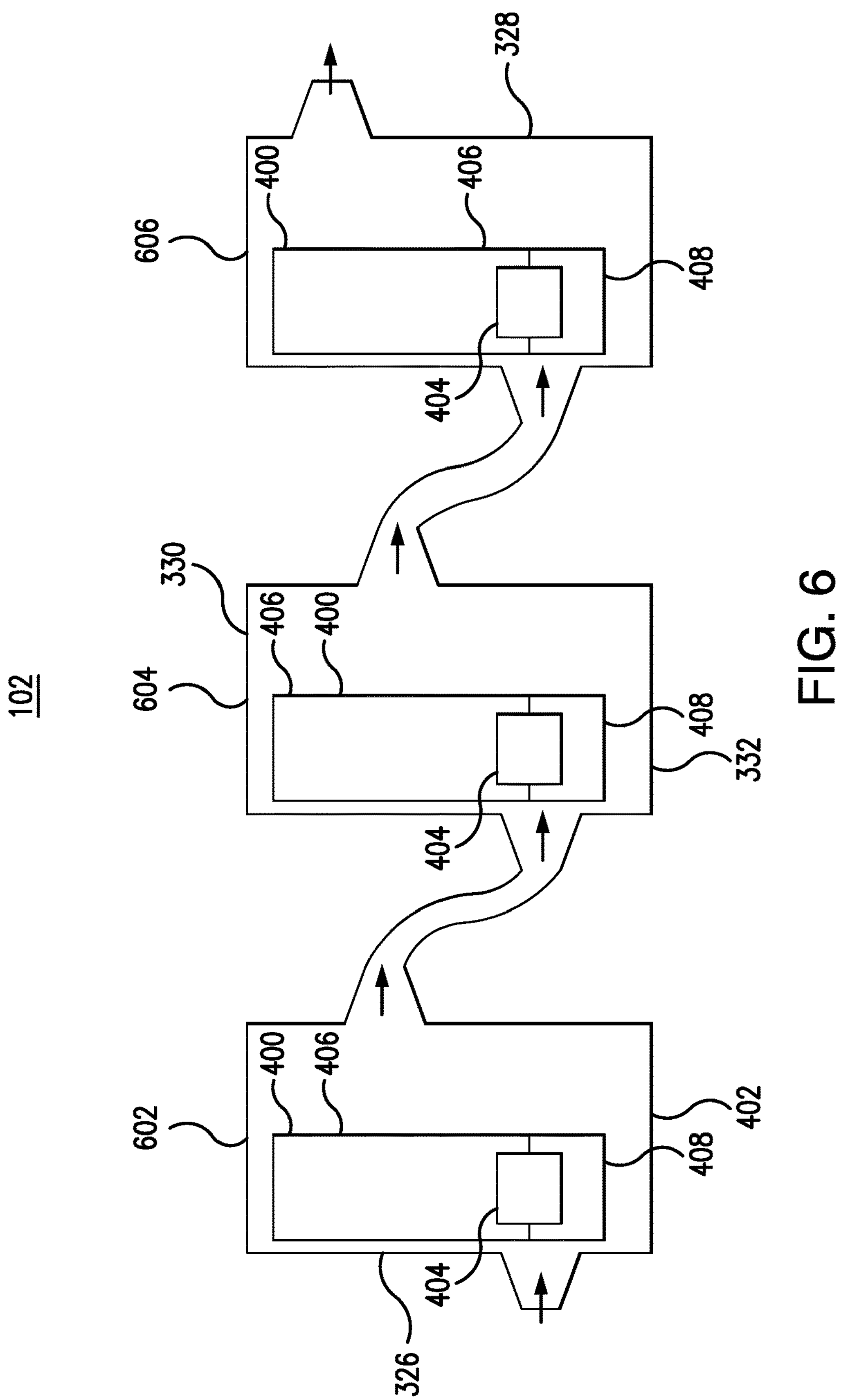
FIG. 6 illustrates an example photodetector in the optical system of FIG. 1.

FIG. 6 illustrates an example photodetector 102 in the optical system 100 of FIG. 1. As seen in FIG. 6, the photodetector 102 includes sections 602, 604, and 606 formed using the substrate 402. The sections 602, 604, and 606 may be connected to each other. In some embodiments, the sections 602, 604, and 606 are connected to each other by a waveguide or a portion of the substrate 402. Notably, the connections between the sections 602, 604, and 606 are different compared to the connections between the sections 502, 504, and 506 shown in FIG. 5. The connections between the sections 602, 604, and 606 may begin closer to the upper end 330 of the substrate 402 and end closer to the lower end 332 of the substrate 402. The upper end 330 and the lower end 332 extend parallel to the direction of propagation of the optical signal. In this manner, the connections between the sections 602, 604, and 606 may align with the beating of the optical signal through the photodetector 102. The photodetector 102 may include any suitable number of cascaded sections.

Each section 602, 604, and 606 includes a photodetector region 400 that includes an optical absorber 404, a region 406, and a region 408. Each absorber 404 is formed on the region 406 and the region 408. In the example of FIG. 6, each region 406 may be a cathode and each region 408 may be an anode. The sections 602, 604, and 606 are positioned such that their corresponding absorbers 404 are separated by a beating length of the optical signal. The absorbers 404 are offset closer to the lower end 332 of the substrate 402 than the upper end 330 according to the beating of the optical signal. As a result, the absorbers 404 are positioned in the photodetector 102 such that the optical signal passes through the absorbers 404 even though the optical signal beats during propagation.

Additionally, in the example of FIG. 6, the anodes are shorter in length than the cathodes in a direction orthogonal to the direction of propagation of an optical signal through the photodetector 102. As a result, the travel distance for the positively charged carriers in the absorbers 404 may be shorter than the travel distance for the negatively charged electrons in the absorber 404. Thus, the speed of the photodetector 102 is improved, in certain embodiments.

The connections between the sections 602, 604, and 606 are arranged to be consistent with the beating of the optical signal through the photodetector 102. For example, due to the beating of the optical signal, the optical signal may be closer to the lower end 332 of the substrate 402 than the upper end 330 when the optical signal passes through the absorbers 404. In between the absorbers 404, the beating of the optical signal may cause the optical signal to be closer to the upper end 330 of the substrate 402 than the lower end 332. Thus, by arranging the connections between the sections 602, 604, and 606 such that the connections begin closer to the upper end 330 of the substrate 402 and end closer to the lower end 332 of the substrate 402, the connections may be more closely aligned with the beating of the optical signal through the photodetector 102, which may reduce optical loss in the photodetector 102, in certain embodiments.

Figure 7:
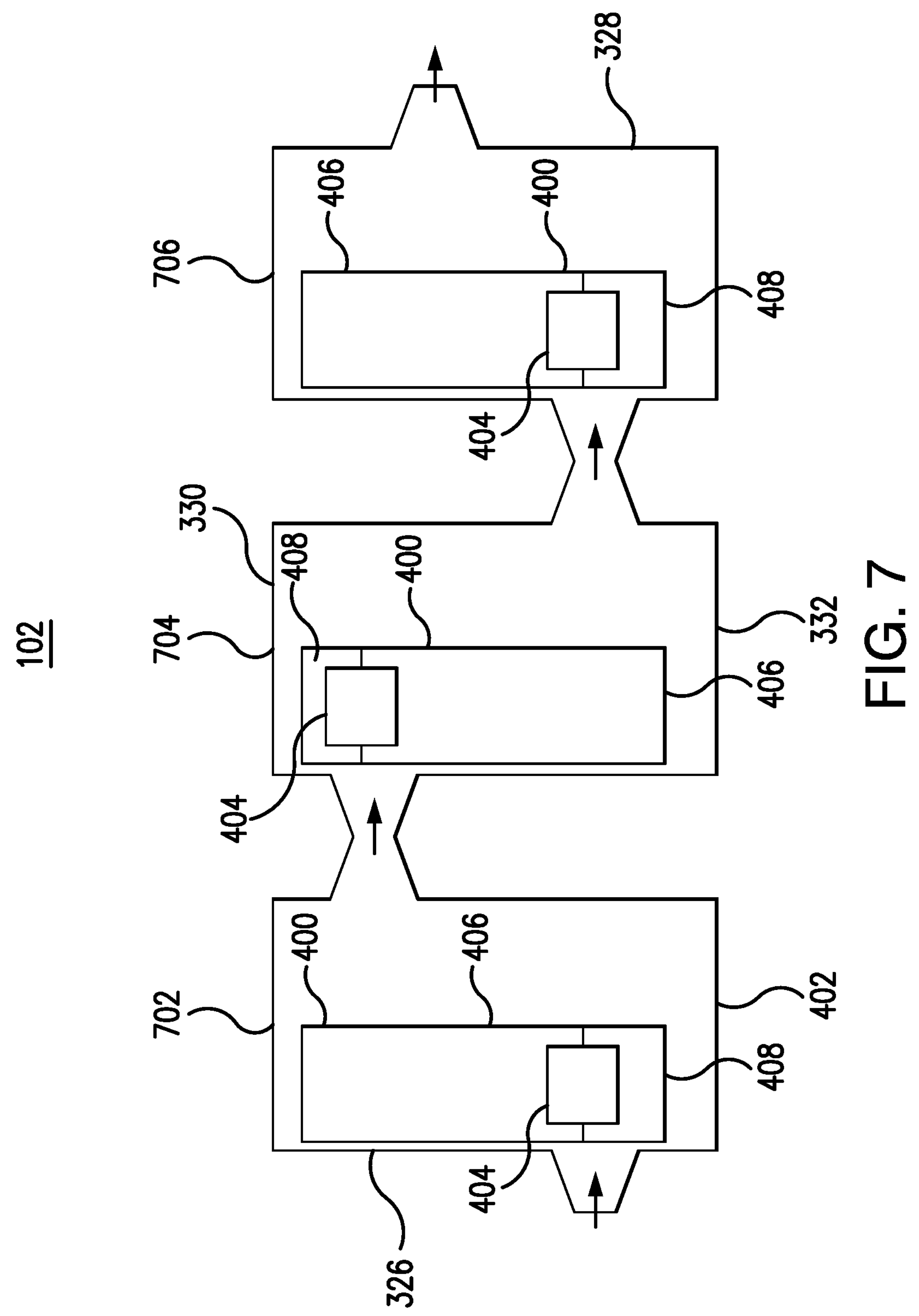
FIG. 7 illustrates an example photodetector in the optical system of FIG. 1.

FIG. 7 illustrates an example photodetector 102 in the optical system 100 of FIG. 1. As seen in FIG. 7, the photodetector 102 includes sections 702, 704, and 706 formed using the substrate 402. The sections 702, 704, and 706 are connected. Notably, the connections between the sections 702, 704, and 706 are linear connections, like the connections between the sections 502, 504, and 506 shown in FIG. 5. However, the connections shown in FIG. 7 are positioned according to the beating of the optical signal through the photodetector 102. The photodetector 102 may include any suitable number of cascaded sections.

As seen in FIG. 7, each of the sections 702, 704, and 706 includes a photodetector region 400 that includes an optical absorber 404, a region 406, and a region 408. Each absorber 404 may be formed on a region 406 and a region 408. In the example of FIG. 7, each region 406 is a cathode and each region 408 is an anode. The length of each anode is shorter than the length of its corresponding cathode, which reduces the travel distance of the positively charged carriers in the absorbers 404.

The sections 702, 704, and 706 may be positioned such that the absorbers 404 are separated by half a beating length of the optical signal in the photodetector 102. The absorbers 404 in the sections 702 and 706 are offset closer to the lower end 332 of the substrate 402 than the upper end 330 according to the beating of the optical signal. The absorber 404 in the section 704 is offset closer to the upper end 330 of the substrate 402 than the lower end 332 according to the beating of the optical signal. The upper end 330 and the lower end 332 extend parallel to the direction of propagation of the optical signal. The absorber 404 in the section 704 is positioned closer to the upper end 330 of the substrate 402, and the absorbers 404 in the sections 702 and 706 are positioned closer to the lower end 332 of the substrate 402. Additionally, the connection between the section 702 and 704 is closer to the upper end 330 of the substrate 402, and the connection between the section 704 and 706 is closer to the lower end 332 of the substrate 402. As a result, the absorbers 404 and the connections between the sections 702, 704, and 706 are positioned such that they align with the beating of the optical signal through the photodetector 102. Stated differently, the absorbers 404 are positioned in the photodetector 102 such that the optical signal passes through the absorbers 404, even though the optical signal beats as the optical signal propagates through the photodetector 102. Additionally, the connections between the sections 702, 704, and 706 are aligned with the optical signal as the optical signal beats through the photodetector 102. As a result, less optical loss may be experienced in the photodetector 102, in certain embodiments.

Figure 8:
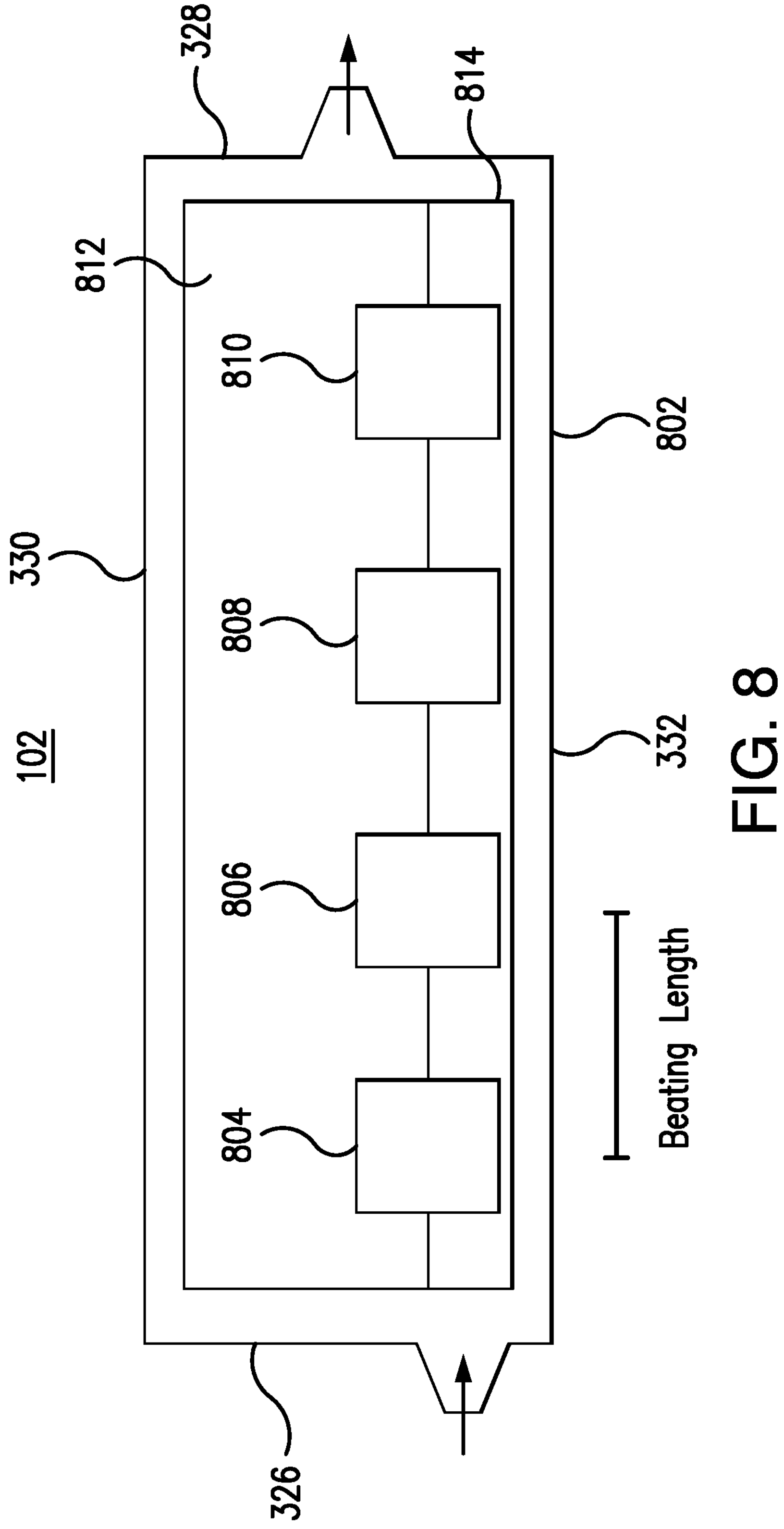
FIG. 8 illustrates an example photodetector in the optical system of FIG. 1.

FIG. 8 illustrates an example photodetector 102 in the optical system 100 of FIG. 1. As seen in FIG. 8, the photodetector 102 includes a substrate 802, optical absorbers 804, 806, 808 and 810, a cathode 812, and an anode 814. The absorbers 804, 806, 808, and 810 are separated from each other by a beating length of the optical signal.

The substrate 802 forms a foundation for the other components of the photodetector 102. The absorbers 804, 806, 808, and 810, the cathode 812, and the anode 814 are formed on, above, or within the substrate 802. The substrate 802 may include any suitable material (e.g., silicon).

In the example of FIG. 8, the cathode 812 and the anode 814 are single structures that support multiple absorbers 804, 806, 808, and 810. The absorbers 804, 806, 808, and 810 may include any suitable material (e.g., germanium). The cathode 812 and the anode 814 may be oppositely doped regions that implement tunnel junctions to the absorbers 804, 806, 808, and 810. Additionally, the length of the anode 814 in the direction orthogonal to the direction of propagation of the optical signal is shorter than the length of the cathode 812 in the same direction. As a result, the travel distance of positively charged carriers in the absorbers 804, 806, 808, and 810 through the anode 814 is shorter than the travel distance of the negatively charged electrons in the absorbers 804, 806, 808, and 810 through the cathode 812. Thus, the speed of the photodetector 102 is improved, in certain embodiments.

The absorbers 804, 806, 808, and 810 are positioned across the substrate 802 in the direction of propagation of the optical signal. The absorbers 804, 806, 808, and 810 are separated by a beating length of the optical signal. Each absorber 804, 806, 808, and 810 is positioned on the cathode 812 and the anode 814 closer to the lower end 332 of the substrate 802 than the upper end 330. The upper end 330 and the lower end 332 extend parallel to the direction of propagation of the optical signal. As a result, the optical signal passes through the absorbers 804, 806, 808, and 810 even though the optical signal beats while propagating through the photodetector 102. In this manner, optical loss is reduced in the photodetector 102, in certain embodiments.

Figure 9:
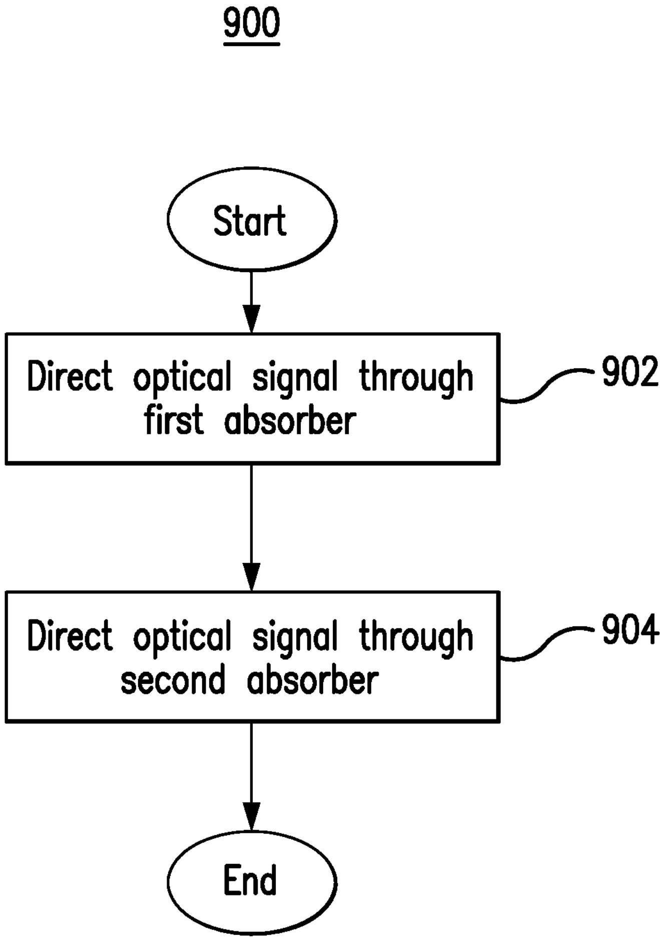
FIG. 9 is a flowchart of an example method performed in the optical system of FIG. 1.

FIG. 9 is a flowchart of an example method 900 performed in the optical system 100 of FIG. 1. In certain embodiments, various components of the photodetector 102 perform the steps of the method 900. By performing the method 900, the photodetector 102 converts an optical signal into an electric signal.

In step 902, an optical signal is directed through a first optical absorber in the photodetector 102. The optical signal may be emitted by a light source and directed into the photodetector 102. The photodetector 102 may then direct the optical signal through a first absorber. The first absorber may be positioned within the photodetector 102 according to the beating of the optical signal in the photodetector 102. For example, the first absorber may be positioned closer to a lower end or an upper end of the photodetector 102, consistent with the beating of the optical signal in the photodetector 102.

In step 904, the photodetector 102 directs the optical signal through a second optical absorber in the photodetector 102. The second absorber may be separated from the first absorber according to the beating length of the optical signal. For example, the second absorber may be positioned a full beating length away from the first absorber, or the second absorber may be positioned a half beating length away from the first absorber. The second absorber may be positioned closer to the upper end or the lower end of the photodetector 102, depending on the beating of the optical signal and the position of the second absorber in the photodetector 102. In some embodiments, the second absorber may be positioned in the photodetector 102 such that the optical signal passes through the second absorber even though the optical signal is beating while propagating through the photodetector 102. As a result, optical loss in the photodetector 102 is reduced, in certain embodiments.

In summary, a photodetector 102 includes optical absorbers positioned according to the beating of an optical signal propagating through the photodetector 102. Specifically, the absorbers may be positioned in the photodetector 102 such that the absorbers align with the optical signal as the optical signal beats during propagation. If the optical signal in one region of the photodetector 102 is closer to one edge of the photodetector 102 as a result of beating, the absorber may be positioned closer to that edge in that region of the photodetector 102. As a result, the absorbers in the photodetector 102 may not be positioned linearly with respect to each other. Rather, the absorbers may be offset from each other such that the absorbers are aligned with the beating of the optical signal. Thus, the absorbers are positioned closer to particular edges of the photodetector 102 relative to other edges. The photogenerated carriers from the absorbers may then be directed to the edges closest to the absorbers, which reduces the travel distance and the transit time of the photocarriers, in certain embodiments. As a result, the speed of the photodetector is improved.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A photodetector comprising:

a substrate;

a first optical absorber disposed in the substrate along a direction of propagation of an optical signal through the substrate, wherein the first optical absorber is offset in the substrate according to an offset of the optical signal in a direction orthogonal to the direction of propagation;

a first doped region disposed in the substrate such that the first doped region contacts the first optical absorber;

a second doped region disposed in the substrate such that the second doped region contacts the first optical absorber, wherein the second doped region has an opposite doping relative to the first doped region, and wherein a length of the first doped region is shorter than a length of the second doped region; and a second optical absorber disposed in the substrate along the direction of propagation of the optical signal, wherein the second optical absorber is offset in the substrate according to the offset of the optical signal in the direction orthogonal to the direction of propagation.

2. The photodetector of claim 1, wherein the substrate comprises a first end, a second end opposite the first end, a third end, and a fourth end opposite the third end, wherein the substrate is arranged such that the optical signal enters the substrate through the third end and exits the substrate through the fourth end, wherein the first optical absorber is offset such that the first optical absorber is closer to the first end than the second end, and wherein the second optical absorber is offset such that the second optical absorber is closer to the second end than the first end.

3. The photodetector of claim 2, wherein the first optical absorber is separated from the second optical absorber by half of a beating length of the optical signal.

4. The photodetector of claim 1, wherein the substrate comprises a first end, a second end opposite the first end, a third end, and a fourth end opposite the third end, wherein the substrate is arranged such that the optical signal enters the substrate through the third end and exits the substrate through the fourth end, wherein the first optical absorber and the second optical absorber are offset such that the first optical absorber and the second optical absorber are closer to the first end than the second end.

5. The photodetector of claim 4, wherein the first optical absorber is separated from the second optical absorber by a beating length of the optical signal.

6. The photodetector of claim 1, wherein the second doped region contacts the second optical absorber.

7. The photodetector of claim 1, wherein the first doped region contacts the second optical absorber.

8. A method comprising:

directing an optical signal through a first optical absorber disposed in a substrate, wherein the first optical absorber is offset in the substrate according to an offset of the optical signal in a direction orthogonal to the direction of propagation, wherein a first doped region and a second doped region are disposed in the substrate such that the first doped region and the second doped region contact the first optical absorber, wherein the second doped region has an opposite doping relative to the first doped region, and wherein a length of the first doped region is shorter than a length of the second doped region; and directing the optical signal through a second optical absorber disposed in the substrate, wherein the second optical absorber is offset in the substrate according to the offset of the optical signal in the direction orthogonal to the direction of propagation.

9. The method of claim 8, wherein the substrate comprises a first end, a second end opposite the first end, a third end, and a fourth end opposite the third end, wherein the substrate is arranged such that the optical signal enters the substrate through the third end and exits the substrate through the fourth end, wherein the first optical absorber is offset such that the first optical absorber is closer to the first end than the second end, and wherein the second optical absorber is offset such that the second optical absorber is closer to the second end than the first end.

10. The method of claim 9, wherein the first optical absorber is separated from the second optical absorber by half of a beating length of the optical signal.

11. The method of claim 8, wherein the substrate comprises a first end, a second end opposite the first end, a third end, and a fourth end opposite the third end, wherein the substrate is arranged such that the optical signal enters the substrate through the third end and exits the substrate through the fourth end, wherein the first optical absorber and the second optical absorber are offset such that the first optical absorber and the second optical absorber are closer to the first end than the second end.

12. The method of claim 11, wherein the first optical absorber is separated from the second optical absorber by a beating length of the optical signal.

13. The method of claim 8, wherein the second doped region contacts the second optical absorber.

14. The method of claim 8, wherein the first doped region contacts the second optical absorber.

15. A photodetector comprising:

a substrate;

a first doped region disposed in the substrate;

a second doped region disposed in the substrate, wherein the second doped region has an opposite doping relative to the first doped region;

a third doped region disposed in the substrate, wherein the third doped region has an opposite doping relative to the first doped region;

a first optical absorber disposed in the substrate along a direction of propagation of an optical signal through the substrate, wherein the first optical absorber contacts the first doped region and the second doped region; and a second optical absorber disposed in the substrate along the direction of propagation of the optical signal, wherein the second optical absorber contacts the first doped region and the third doped region, wherein the first optical absorber and the second optical absorber are positioned closer to a lower end of the substrate than an upper end of the substrate opposite the lower end, and wherein the upper end and the lower end extend parallel to a direction of propagation of the optical signal.

16. The photodetector of claim 15, further comprising:

a fourth doped region disposed in the substrate, wherein the fourth doped region has an opposite doping relative to the first doped region, wherein the first doped region comprises a first end and a second end opposite the first end, and wherein the first optical absorber and the second optical absorber are positioned along the first end; and a third optical absorber disposed in the substrate along the direction of propagation of the optical signal, wherein the third optical absorber contacts the first doped region and the fourth doped region, and wherein the third optical absorber is positioned along the second end.

17. The photodetector of claim 16, wherein the third optical absorber is positioned closer to the upper end than the lower end.

18. The photodetector of claim 15, the first optical absorber comprises germanium.

* * * * *